(12) United States Patent
Drillet et al.

(10) Patent No.: US 10,597,745 B2
(45) Date of Patent: Mar. 24, 2020

(54) HIGH STRENGTH STEEL AND MANUFACTURING METHOD

(71) Applicant: ArcelorMittal, Luxembourg (LU)

(72) Inventors: Josée Drillet, Rozerieulles (FR); Véronique Hebert, Saint-Julien-les-Metz (FR)

(73) Assignee: ARCELORMITTAL, Luxembourg (LU)

( * ) Notice: Subject to any disclaimer, the term of this patent is extended or adjusted under 35 U.S.C. 154(b) by 521 days.

(21) Appl. No.: 15/102,386

(22) PCT Filed: Dec. 5, 2014

(86) PCT No.: PCT/IB2014/066647
§ 371 (c)(1),
(2) Date: Jun. 7, 2016

(87) PCT Pub. No.: WO2015/087224
PCT Pub. Date: Jun. 18, 2015

(65) Prior Publication Data
US 2016/0312326 A1 Oct. 27, 2016

(30) Foreign Application Priority Data
Dec. 11, 2013 (WO) ................ PCT/US2013/074482

(51) Int. Cl.
*C21D 8/02* (2006.01)
*C22C 38/38* (2006.01)
(Continued)

(52) U.S. Cl.
CPC ............. *C21D 9/46* (2013.01); *C21D 8/0205* (2013.01); *C21D 8/0226* (2013.01);
(Continued)

(58) Field of Classification Search
CPC ........ C21D 2211/002; C21D 2211/004; C21D 2211/008; C21D 1/26; C21D 1/28;
(Continued)

(56) References Cited

U.S. PATENT DOCUMENTS

| 6,224,689 B1 | 5/2001 | Koo et al. |
| 6,251,198 B1 | 6/2001 | Koo et al. |

(Continued)

FOREIGN PATENT DOCUMENTS

| CN | 101932745 A | 12/2010 |
| CN | 101932746 A | 12/2010 |

(Continued)

OTHER PUBLICATIONS

Hiroshi Matsuda et al., "Effects of Auto-Tempering Behaviour of Martensite on Mechanical Properties of Ultra high Strength Steel Sheets", Journal of Alloys and Compounds, vol. 577, Nov. 1, 2013, pp. S661-S667.

(Continued)

*Primary Examiner* — Scott R Kastler
*Assistant Examiner* — Vanessa T. Luk
(74) *Attorney, Agent, or Firm* — Davidson, Davidson & Kappel, LLC

(57) ABSTRACT

A cold-rolled and annealed steel sheet is provided, the chemical composition of which comprises, the contents being expressed by weight percent:
$0.10 \leq C \leq 0.13\%$
$2.4 \leq Mn \leq 2.8\%$
$0.30 \leq Si \leq 0.55\%$
$0.30 \leq Cr \leq 0.56\%$
$0.020 \leq Ti \leq 0.050\%$
$0.0020 \leq B \leq 0.0040\%$
$0.005 \leq Al \leq 0.050\%$
$Mo \leq 0.010\%$ (Continued)

Nb≤0.040%
0.002≤N≤0.008%
S≤0.005%
P≤0.020%, the remainder consisting of iron and unavoidable impurities resulting from the smelting, the steel sheet having a microstructure consisting of, in surface proportion, martensite and/or lower bainite, said martensite comprising fresh martensite and/or self-tempered martensite, the sum of the surface proportions of martensite and lower bainite being comprised between 60 to 95%, 4 to 35% of low carbide containing bainite, 0 to 5% of ferrite, and less than 5% of retained austenite in island form.

21 Claims, 1 Drawing Sheet

(51) Int. Cl.

| | |
|---|---|
| *C21D 9/46* | (2006.01) |
| *C22C 38/28* | (2006.01) |
| *C22C 38/32* | (2006.01) |
| *C21D 8/04* | (2006.01) |
| *C21D 9/48* | (2006.01) |
| *C22C 38/00* | (2006.01) |
| *C23C 2/40* | (2006.01) |
| *C23C 14/16* | (2006.01) |
| *C23C 2/28* | (2006.01) |
| *C22C 38/02* | (2006.01) |
| *C22C 38/06* | (2006.01) |
| *C22C 38/22* | (2006.01) |
| *C22C 38/26* | (2006.01) |
| *C23C 2/02* | (2006.01) |
| *C23C 2/06* | (2006.01) |
| *C23C 2/36* | (2006.01) |

(52) U.S. Cl.
CPC ......... *C21D 8/0236* (2013.01); *C21D 8/0247* (2013.01); *C21D 8/0263* (2013.01); *C21D 8/0273* (2013.01); *C21D 8/0278* (2013.01); *C21D 8/0436* (2013.01); *C21D 8/0447* (2013.01); *C21D 8/0473* (2013.01); *C21D 9/48* (2013.01); *C22C 38/00* (2013.01); *C22C 38/001* (2013.01); *C22C 38/002* (2013.01); *C22C 38/02* (2013.01); *C22C 38/06* (2013.01); *C22C 38/22* (2013.01); *C22C 38/26* (2013.01); *C22C 38/28* (2013.01); *C22C 38/32* (2013.01); *C22C 38/38* (2013.01); *C23C 2/02* (2013.01); *C23C 2/06* (2013.01); *C23C 2/28* (2013.01); *C23C 2/36* (2013.01); *C23C 2/40* (2013.01); *C23C 14/16* (2013.01); *C21D 2211/002* (2013.01); *C21D 2211/004* (2013.01); *C21D 2211/008* (2013.01)

(58) Field of Classification Search
CPC .... C21D 1/30; C21D 1/32; C21D 9/46; C23C 14/14; C23C 14/16; C23C 14/165; C23C 14/228; C23C 14/24
See application file for complete search history.

(56) References Cited

U.S. PATENT DOCUMENTS

| | | |
|---|---|---|
| 7,892,654 B2 | 2/2011 | Hofmann et al. |
| 8,828,557 B2 | 9/2014 | Tagagi et al. |
| 8,840,834 B2 | 9/2014 | Matsuda et al. |
| 9,856,548 B2 | 1/2018 | Allain |
| 2011/0030854 A1 | 2/2011 | Matsuda et al. |
| 2011/0048589 A1 | 3/2011 | Matsuda et al. |
| 2011/0168000 A1 | 7/2011 | Langner |
| 2011/0168300 A1 | 7/2011 | Moulin et al. |
| 2011/0240176 A1 | 10/2011 | Kaneko et al. |
| 2012/0040203 A1 | 2/2012 | Takagi et al. |
| 2012/0132327 A1 | 5/2012 | Mukai et al. |
| 2012/0175028 A1 | 7/2012 | Matsuda et al. |
| 2012/0312433 A1 | 12/2012 | Mizuta et al. |
| 2013/0000798 A1 | 1/2013 | Sadasue |
| 2013/0209833 A1 | 8/2013 | Scott et al. |
| 2014/0234660 A1 | 8/2014 | Kawate et al. |
| 2014/0342185 A1 | 11/2014 | Nonaka et al. |
| 2015/0167133 A1 | 6/2015 | Paul et al. |
| 2016/0160310 A1 | 6/2016 | Hasegawa et al. |
| 2019/0093210 A1 | 3/2019 | Silberberg et al. |

FOREIGN PATENT DOCUMENTS

| | | |
|---|---|---|
| CN | 102227511 A | 10/2011 |
| CN | 102414335 A | 4/2012 |
| CN | 102471849 A | 5/2012 |
| EP | 2246456 A1 | 11/2010 |
| EP | 2258887 A1 | 12/2010 |
| EP | 2371979 A1 | 10/2011 |
| EP | 2426230 A1 | 3/2012 |
| EP | 2460901 A1 | 6/2012 |
| JP | 2002180182 A | 6/2002 |
| JP | 2005179703 A | 7/2005 |
| JP | 2007177271 A | 7/2007 |
| JP | 2009052106 A * | 3/2009 |
| JP | 2009529098 A | 8/2009 |
| JP | 2009203549 A | 9/2009 |
| JP | 2009203550 A | 9/2009 |
| JP | 2009242816 A | 10/2009 |
| JP | 2011202207 A | 10/2011 |
| JP | 2012031462 A | 2/2012 |
| JP | 2012512959 A | 6/2012 |
| JP | 2013227657 A | 11/2013 |
| KR | 20120049622 A | 5/2012 |
| RU | 2203330 C2 | 4/2003 |
| RU | 2215813 C2 | 11/2003 |
| RU | 2493287 C2 | 9/2013 |
| WO | 2013105638 A1 | 7/2013 |
| WO | 2013144376 A1 | 10/2013 |
| WO | 2013047821 A1 | 3/2015 |

OTHER PUBLICATIONS

Jean-Christophe Hell et al. "Microstructure-Properties Relationships in Carbide-Free Bainitic Steels", Isil International, vol. 51 ( May 6, 2011), No. 10, pp. 1724-1732.

* cited by examiner

HIGH STRENGTH STEEL AND MANUFACTURING METHOD

FIELD OF THE INVENTION

The present invention relates to a cold-rolled and annealed steel sheet having a very high tensile strength and a deformability for manufacturing parts by forming, in particular in the automobile industry, for the manufacture of motor vehicle structural elements, and to the manufacture of such a steel sheet.

BACKGROUND

Steels have been developed having a very favorable yield strength/tensile strength ratio during forming operations.

Their strengthening capacity is very high, which allows a good distribution of deformations in the case of a collision and allows obtaining a significantly higher yield strength on parts after forming. It is thus possible to produce parts that are as complex as with traditional steels, but with higher mechanical properties, which allows a decrease in thickness to keep identical functional specifications. In this way, these steels have an effective response to the lightening and safety requirements of vehicles.

In particular, steels whose structure comprises martensite, optionally bainite, within a ferritic matrix, have experienced major development, since they combine high strength with significant deformation possibilities.

The recent requirements of lightening and reducing energy consumption have led to increased demand for very high-strength steels, the tensile strength TS of which is greater than 1180 MPa.

Aside from this level of strength, these steels must have a good ductility, good weldability and good coatability, in particular good suitability for continuous galvanization by hardening.

These steels must also have a high yield strength and elongation at break, as well as a good formability.

Indeed, certain automobile parts are manufactured through forming operations combining different deformation modes. Certain microstructural features of the steel may prove to be well suited to one deformation mode, but unfavorable with respect to another mode. Certain portions of the parts must have a high tensile strength and/or a good bendability and/or a good cut-edge formability.

This cut-edge formability is assessed by determining a hole expansion ratio, denoted Ac %. This hole expansion ratio measures the suitability of the steel for undergoing an expansion during cold pressing, and therefore provides an assessment of the formability of the steel in this deformation mode.

The hole expansion ratio may be assessed as follows: after producing a hole by cutting in a steel sheet, a frustoconical tool is used so as to expand the edges of that hole. During this operation, it is possible to observe early damage near the edges of the hole during the expansion, this damage beginning on second phase particles or at the interfaces between the different microstructural components in the steel.

Described in standard ISO 16630:2009, the hole expansion method consists of measuring the initial diameter Di of the hole before pressing, then the final diameter Df of the hole after pressing, determined when cracks are observed crossing through the thickness of the steel sheet on the edges of the hole. The suitability for hole expansion Ac % is then determined using the following formula:

$$Ac\ \% = 100 * \frac{D_f - D_i}{D_i}.$$

Ac % therefore makes it possible to quantify the suitability of a steel sheet to withstand pressing at a cut-out orifice. According to this method, the initial diameter is 10 millimeters.

According to documents US 2012/0312433 A1 and US 2012/132327 A1, steels are known having a tensile strength TS greater than 1180 MPa. Nevertheless, this tensile strength is obtained to the detriment of the formability and weldability.

Furthermore, according to documents US 2013/0209833 A1, US 2011/0048589 A1, US 2011/0168300 A1 and WO 2013/144376 A1, steels are known having a high tensile strength that may exceed 1000 MPa, but not simultaneously having a satisfactory formability and weldability.

SUMMARY

Under these conditions, one of the objects of various embodiments of the the present invention consists of providing a steel sheet having a high tensile strength, in particular comprised between 1180 and 1320 MPa, together with a high yield strength, in particular comprised between 800 and 970 MPa, this value being determined before any skin-pass operation on the steel sheet, and a good formability, in particular a hole expansion ratio Ac % greater than or equal to 30%, a bending angle, for a steel sheet with a thickness comprised between 0.7 mm and 1.5 mm, greater than or equal to 55°, and an elongation at break greater than 5%.

To that end, the invention relates to a cold-rolled and annealed steel sheet, having a chemical composition comprising, the contents being expressed by weight percent:

0.10≤C≤0.13%
2.4≤Mn≤2.8%
0.30≤Si≤0.55%
0.30≤Cr≤0.56%
0.020≤Ti≤0.050%
0.0020≤B≤0.0040%
0.005≤Al≤0.050%
Mo≤0.010%
Nb≤0.040%
0.002≤N≤0.008%
S≤0.005%
P≤0.020%, the remainder consisting of iron and unavoidable impurities resulting from the smelting, the steel sheet having a microstructure consisting of, in surface proportion, martensite and/or lower bainite, said martensite comprising fresh martensite and/or self-tempered martensite, the sum of the surface proportions of martensite and lower bainite being comprised between 60 to 95%, 4 to 35% of low carbide containing bainite, 0 to 5% of ferrite, and less than 5% of retained austenite in island form.

In some embodiments, the steel sheet according to the invention further includes one or more of the following features:

said microstructure comprises, in surface proportion, 4% to 20% of fresh martensite, preferably 4% to 15%;
said microstructure comprises, in surface proportion, 40 to 95% of self-tempered martensite and lower bainite;

said self-tempered martensite and said lower bainite contain rod-shaped carbides oriented in the directions <111> of the martensite and bainite laths;

said low carbide containing bainite contains less than 100 carbides per surface unit of 100 square micrometers;

said microstructure comprises, in surface proportion, 4 to 5% of ferrite;

the smallest dimension of the retained austenite islands is smaller than 50 nanometers;

the fraction of former austenite grains created by the annealing whose size is less than one micrometer represents less than 10% of the total population of said former austenite grains;

said steel sheet has a tensile strength comprised between 1180 MPa and 1320 MPa, and a hole expansion ratio Ac % greater than or equal to 40%;

said steel sheet has a thickness comprised between 0.7 mm and 1.5 mm, and said steel sheet has a bending angle greater than or equal to 55°;

the chemical composition comprises, the content being expressed by weight percent:
2.5≤Mn≤2.8%;

the chemical composition comprises, the content being expressed by weight percent:
0.30≤Si≤0.5%;

the chemical composition comprises, the content being expressed by weight percent:
0.005≤Al≤0.030%;

said steel sheet comprises a zinc or zinc alloy coating, obtained through hot-dip coating;

said zinc or zinc alloy coating is a galvannealed coating, said zinc or zinc alloy coating comprising from 7 to 12% of iron;

said steel sheet comprises a zinc or zinc alloy coating, obtained through vacuum deposition.

The present invention may also relate to a method for manufacturing a cold-rolled and annealed steel sheet according to the invention, comprising the following successive steps:

providing a semi-finished steel having chemical composition comprising, the contents being expressed by weight percent:
0.10≤C≤0.13%
2.4≤Mn≤2.8%
0.30≤Si≤0.55%
0.30≤Cr≤0.56%
0.020≤Ti≤0.050%
0.0020≤B≤0.0040%
0.005≤Al≤0.050%.
Mo≤0.010%
Nb≤0.040%
0.002≤N≤0.008%
S≤0.005%
P≤0.020%
the remainder consisting of iron and unavoidable impurities resulting from the smelting, then Heating said semi-finished steel to a temperature $T_{reheat}$ greater than or equal to 1250° C., then Hot-rolling said semi-finished steel, the end of rolling temperature being greater than the temperature Ar3 of the beginning of transformation of the austenite upon cooling, to obtain a hot-rolled steel sheet, then Cooling said hot-rolled steel sheet at a rate sufficient to avoid the formation of ferrite and perlite, then Coiling said hot-rolled steel sheet at a temperature below 580° C., then Cold-rolling said hot-rolled steel sheet to obtain a cold-rolled steel sheet, then Reheating said cold-rolled steel sheet between 600° C. and Ac1, Ac1 designating the beginning of austenitic transformation temperature upon heating, with a heating rate $V_R$ comprised between 1 and 20° C./s, then Reheating said cold-rolled steel sheet to a temperature Tm comprised between Ac3'−10° C. and Ac3'+30° C., and holding said cold-rolled steel sheet at said temperature Tm for a time Dm comprised between 50 and 150 seconds, with Ac3'=Min {Ac3+1200/Dm; 1000° C.}, where Ac3 and Ac3' are expressed in degrees Celsius and Dm in seconds, and where Ac3 designates the end of austenitic transformation temperature upon heating as determined independently from the holding time at that temperature Ac3, then Cooling the steel sheet at a rate comprised between 10 and 150° C./s to a temperature Te comprised between 460° C. and 490° C., then Holding said steel sheet at the temperature Te for a time comprised between 5 and 150 seconds, then Coating the steel sheet by continuous dipping in a zinc or zinc alloy bath at a temperature TZn comprised between 450° C. and 480° C., said temperatures Te and TZn being such that 0≤(Te−TZn)≤10° C., then Optionally heating the coated steel sheet to a temperature comprised between 490° C. and 550° C. for a time to comprised between 10 s and 40 s.

The invention also relates to a method for manufacturing a cold-rolled and annealed steel sheet according to the invention, comprising the following successive steps:

Providing a semi-finished steel having a chemical composition comprising, the contents being expressed by weight percent:
0.10≤C≤0.13%
2.4≤Mn≤2.8%
0.30≤Si≤0.55%
0.30≤Cr≤0.56%
0.020≤Ti≤0.050%
0.0020≤B≤0.0040%
0.005≤Al≤0.050%
Mo≤0.010%
Nb≤0.040%
0.002≤N≤0.008%
S≤0.005%
P≤0.020%
the remainder consisting of iron and unavoidable impurities resulting from the smelting, then Heating said semi-finished steel to a temperature $T_{reheat}$ greater than or equal to 1250° C., then Hot-rolling said semi-finished steel, the end of rolling temperature being greater than Ar3, to obtain a hot-rolled steel sheet, then Cooling said hot-rolled steel sheet at a rate sufficient to avoid the formation of ferrite and perlite, then Coiling said hot-rolled steel sheet at a temperature below 580° C., then Cold-rolling said hot-rolled steel sheet to obtain a cold-rolled steel sheet, then Reheating said cold-rolled steel sheet between 600° C. and Ac1, Ac1 designating the beginning of austenitic transformation temperature upon heating, at a heating rate $V_R$, comprised between 1 and 20° C./s, then Reheating said cold-rolled steel sheet to a temperature Tm comprised between Ac3−10° C. and Ac3+30° C., and holding said cold-rolled steel sheet at the temperature Tm for a time Dm comprised between 50 and 150 seconds, with Ac3'=Min {Ac3+1200/Dm; 1000° C.}, where Ac3 and Ac3' are expressed in degrees Celsius and Dm in seconds, and where Ac3 designates the end of austenitic transformation temperature upon heating as determined independently of the holding time at that temperature Ac3, then Cooling the steel sheet at a rate comprised between 10 and 100° C./s to a temperature Te comprised between 460° C. and 490° C., then Holding said steel sheet at the temperature Te for a time comprised between 5 and 150 seconds, then Cooling said steel sheet to ambient temperature.

In embodiments, the latter method further includes one or more of the following features:

a zinc or zinc alloy coating is performed by vacuum deposition after said cooling step to ambient temperature;

said vacuum deposition is performed by physical vapor deposition (PVD);

said vacuum deposition is performed by jet vapor deposition (JVD).

BRIEF DESCRIPTION OF THE DRAWINGS

The features and advantages of the invention will appear upon reading the description below, provided as an example and done in reference to the appended figures, in which.

DETAILED DESCRIPTION

Figure 1:
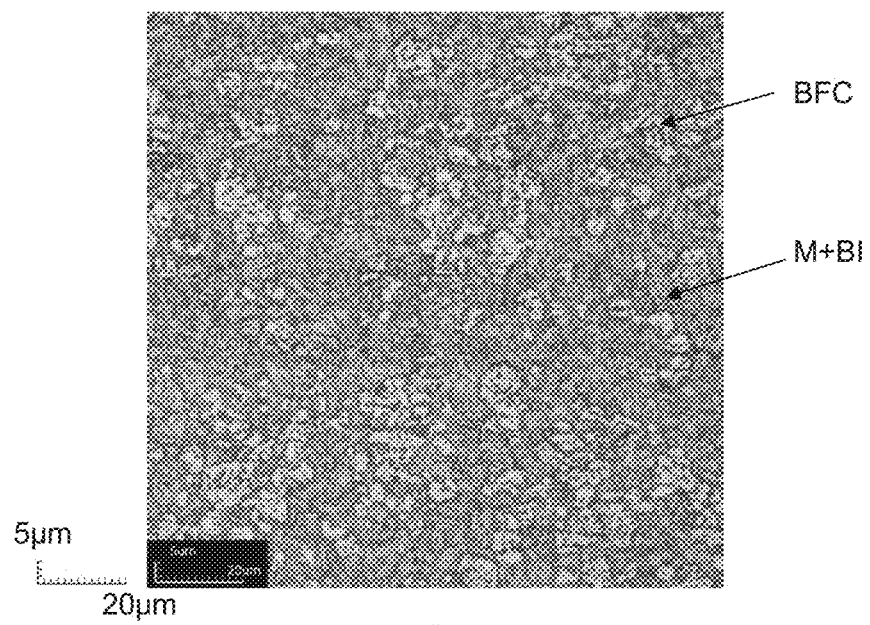
FIG. 1 shows the microstructure of a steel sheet according to the invention, shown by a first type of etching.

Throughout the application, Ar3 will designate the beginning of transformation temperature of the austenite upon cooling.

Furthermore, Ac1 will designate the beginning of allotropic transformation temperature upon heating of the steel.

Furthermore, Ac3 will designate the end of austenitic transformation temperature upon heating as calculated by the Thermo-Calc® program, known in itself. This calculation does not involve the holding time at the temperature Ac3.

However, the end of austenitic transformation temperature upon heating depends on the holding time at the plateau, denoted Dm. Reference Ac3' will thus refer to the corrected minimum end of austenitic transformation temperature upon heating, determined using the formula: Ac3'=Min {Ac3+1200/Dm; 1000° C.}. where Ac3 and Ac3' are expressed in degrees Celsius and Dm in seconds. Min {Ac3+1200/Dm; 1000° C.}) designates the smallest value here from among the two quantities: (Ac3+1200/Dm) and 1000° C. Thus, if Ac3+1200/Dm is less than or equal to 1000° C., Ac3'=Ac3+1200/Dm. However, if Ac3+1200/Dm is greater than 1000° C., Ac3'=1000° C. It is thus considered that even when the holding time at the plateau is very short, a temperature of 1000° C. makes it possible to obtain an austenitic structure.

This temperature Ac3' is such that when the steel is held at the temperature Ac3' for a holding time equal to Dm, the steel sheet is entirely in the austenitic phase.

The martensite results from the transformation without diffusion of the austenite γ below the beginning of martensitic transformation temperature Ms upon cooling.

The martensite assumes the form of fine laths elongated in one direction, and oriented inside each initial grain of austenite. The term martensite includes both fresh martensite and self-tempered martensite.

A distinction will be made below between self-tempered martensite and fresh martensite (i.e., not tempered and not self-tempered).

In particular, self-tempered martensite is present in the form of fine laths comprising iron carbides dispersed in these laths, in the form of rods oriented in the directions <111> of the mesh α of laths. This self-tempered martensite is formed in the case of a rapid cooling cycle below the martensitic transformation temperature Ms. The iron carbides dispersed in the laths are formed by precipitation below the martensitic transformation temperature Ms when the cooling is not slow enough to produce fresh martensite. On the contrary, fresh martensite does not comprise carbides.

Bainite, formed during the cooling from the austenitic range, above the beginning of martensitic transformation temperature Ms, assumes the form of an aggregate of ferrite laths and cementite particles. Its formation involves a short-distance diffusion.

A distinction will be made below between lower bainite and low carbide containing bainite.

Lower bainite is formed, during cooling, in a temperature range immediately above the martensitic transformation start temperature Ms. It assumes the form of fine laths and comprises carbides dispersed in those laths.

Furthermore, low carbide containing bainite will refer to bainite containing less than 100 carbides per surface unit of 100 square micrometers. Low carbide containing bainite is formed, during cooling, between 550° C. and 450° C.

Unlike low carbide containing bainite, lower bainite always contains more than 100 carbides per surface unit of 100 square micrometers.

In the chemical composition of the steel, carbon plays a role in the formation of the microstructure and in the mechanical properties.

The weight content of carbon is comprised between 0.10% and 0.13%. This carbon content range makes it possible to simultaneously obtain a tensile strength greater than 1180 MPa, an elongation at break greater than 5%, and a satisfactory hole expansion ratio Ac %, greater than 30%, or even greater than 40%. In particular, a carbon content level below 0.10% does not make it possible to achieve a sufficient tensile strength. For a higher carbon content, greater than 0.13%, the weldability tends to decrease. Furthermore, the temperature Ms drops, such that the fraction of fresh martensite, i.e., not tempered and not self-tempered, in the microstructure tends to increase and thus deteriorate the hole expansion ratio.

The weight content of manganese is comprised between 2.4% and 2.8%, preferably between 2.5% and 2.8%. Manganese is a gammagenous element, which lowers the temperature Ac3 and lowers the temperature Ms for the beginning of formation of the martensite. The low carbon content of the steel may lead to a high temperature Ac3, above 850° C. A manganese content greater than 2.4% makes it possible, by decreasing the value of the temperature Ac3, to obtain a complete austenization of the steel between 840° C. and 850° C., after holding at that temperature for a time of at least 50 s. The manganese also enables the formation of self-tempered martensite and therefore contributes to obtaining a hole expansion ratio Ac % greater than or equal to 40%. The manganese content level is limited to 2.8%, in order to limit the formation of band structures.

Silicon is an element participating in the hardening in solid solution, the content level of which by weight in the steel is comprised between 0.30% and 0.55%, preferably between 0.30% and 0.5%. A content level of at least 0.30% makes it possible to obtain sufficient hardening of the ferrite and/or bainite. The content by weight of silicon is limited to 0.55% to guarantee a hole expansion ratio Ac % greater than or equal to 40%, while limiting the formation of upper bainite. Furthermore, an increase in the silicon content level would deteriorate the coatability of the steel by favoring the formation of oxides adhering to the surface of the steel sheet.

Furthermore, the silicon decreases the weldability. The weldability may in particular be estimated using the carbon equivalent Ceq, for example calculated using the formula published by Nishi, T et al., in "*Evaluation of high-strength steels for automobile use*", Nippon Steel technical report, No. 20, pp. 37-44, 1982, in which the content levels of the elements are expressed by weight percent:

$$Ceq=C+Mn/20+Si/30+P+S*2.$$

A silicon content level below 0.55% in particular contributes to guaranteeing both very good weldability, in particular a carbon equivalent calculated using the Nishi formula of less than or equal to 0.30%, as well as good coatability.

The silicon is also alphagenous, and therefore contributes to increasing the temperature Ac3, and favoring the formation of low carbide containing bainite. A silicon content level below 0.55% thus contributes to avoiding the formation of an excessive quantity of low carbide containing bainite.

The composition of the steel sheet further includes chromium in a content greater than or equal to 0.30%, so as to improve the hardenability of the steel, and to increase its hardness as well as its tensile strength. The chromium content level must be less than or equal to 0.56%, so as to retain a satisfactory elongation at break and limit costs.

Titanium is present in the steel in a content comprised between 0.020% and 0.050%. In a content comprised between 0.020% and 0.050%, the titanium essentially combines with nitrogen and carbon to precipitate in the form of nitrides and/or carbonitrides. Below 0.020%, the tensile strength of 1180 MPa is not achieved. The titanium also has a positive influence on the weldability of the steel.

Beyond a titanium content level of 0.050%, there is a risk of forming coarse titanium nitrides precipitated from the liquid state, which tend to reduce the ductility, and lead to early damage during the hole expansion. Indeed, when nitrides with a size larger than 6 microns are present, it is observed that the majority of these are at the origin of cleavage with the matrix during cutting and pressing steps. The titanium also makes it possible to ensure that the nitrogen is fully combined in the form of nitrides or carbonitrides, such that the boron is in free form and may play an effective role in the hardenability.

The weight content of boron is comprised between 0.0020% and 0.0040%.

By limiting the activity of the carbon, the boron indeed makes it possible to control and limit the diffusive phase transformations (ferritic or pearlitic transformation during cooling) and to form hardening phases (bainite or martensite) necessary to obtain high tensile strength characteristics. The addition of boron further makes it possible to limit the addition of hardening elements such as Mn, Mo, Cr and to reduce the analytic cost of the steel grade. According to the invention, the minimum boron content level to ensure effective hardenability is 0.0020%. Beyond 0.0040%, the effect on hardenability is saturated and a harmful effect on the coatability and ductility is observed.

The composition of the steel sheet further optionally includes molybdenum, in a content below 0.010%. The molybdenum, like the chromium, plays an effective role in hardenability. However, a content level above 0.010% excessively increases the cost of the additions.

The chemical composition of the hot-rolled steel sheet optionally includes niobium, with a weight content level below 0.040%. Beyond a weight content level of 0.040%, the recrystallization of the austenite is delayed. The structure then contains a significant fraction of elongated grains, which no longer makes it possible to achieve the targeted hole expansion ratio Ac %.

Furthermore, it is provided that the weight content level of the nitrogen is comprised between 0.002% and 0.008%. In order to form a sufficient quantity of nitrides and carbonitrides, the nitrogen content level must be above 0.002%. The nitrogen content level must be below 0.008% in order to avoid a precipitation of boron nitrides, which would decrease the quantity of free boron.

A weight content level of aluminum comprised between 0.005% and 0.050% makes it possible to ensure the deoxidation of the steel during its manufacture.

An aluminum content level must be below 0.050%, or below 0.030% to avoid an increase in the temperature Ac3 and avoid the formation of ferrite during cooling.

The composition optionally comprises sulfur and phosphorus.

The sulfur content level must be below 0.005%. Beyond a sulfur content level of 0.005%, the ductility is reduced due to the excessive presence of sulfides such as MnS that decrease the deformability, in particular the hole expansion ratio Ac %.

The phosphorus content level must be below 0.020%. Indeed, phosphorus is an element that imparts solid solution hardening, but that decreases the spot weldability and hot ductility, particularly due to its suitability for segregation at the grain boundaries or for co-segregation with manganese.

The microstructure of the steel sheet according to the invention comprises, in surface proportion, 60 to 95% of martensite and lower bainite, 4 to 35% of low carbide containing bainite, 0 to 5% of ferrite, and less than 5% of retained austenite in island form.

In the context of the invention, the sum of the surface proportions of martensite and lower bainite is considered, this total surface fraction being comprised between 60 to 95%.

As previously indicated, a distinction is made between self-tempered martensite and fresh martensite, i.e., not tempered and not self-tempered.

According to one embodiment, the martensite is in particular formed by self-tempered martensite, the surface proportion of the sum of the self-tempered martensite and the lower bainite being at least 40% of the entire microstructure, and up to 95%.

The self-tempered martensite and the lower bainite are present in the form of fine laths, and comprise carbides dispersed in those laths.

In particular, the self-tempered martensite and the lower bainite comprise iron carbides $Fe_2C$ and $Fe_3C$ in the form of rods oriented in the directions <111> of the mesh $\alpha$ of the martensite and bainite laths.

The proportions of self-tempered martensite and lower bainite are specified jointly, since the self-tempered martensite and the lower bainite have substantially the same role regarding the usage properties of the steel. Furthermore, these two components, present in the form of fine laths, cannot be identified individually from one another upon scanning electron microscopy observations.

A surface percentage of self-tempered martensite and lower bainite comprised between 40% and 95% makes it possible to favor the formability of the steel, in particular its bendability and its cut-edge formability. A percentage of self-tempered martensite and lower bainite of at least 40% thus makes it possible to obtain a good bending angle, in particular a bending angle for steel sheets with a thickness comprised between 0.7 mm and 1.5 mm, of at least 55°, and a good hole expansion ratio Ac %. in particular greater than or equal to 40%.

The percentage of self-tempered martensite and lower bainite in the microstructure is preferably less than 95%, in order to retain a sufficient percentage of low carbide containing bainite, making it possible to obtain an elongation at break of at least 5%.

The martensite may further comprise partly fresh martensite, in a surface proportion comprised between 4 and 20% of the entire microstructure, preferably between 4% and 15%.

The fresh martensite does not comprise carbides.

The surface percentage of fresh martensite must be below 20%. preferably below 15%, in particular to avoid deteriorating the fragility of the steel and to ensure a good hole expansion ratio.

In particular, the surface percentage of the fresh martensite in band form must be minimized. A martensite band refers to a long martensite island having an elongated morphology. In particular, such a band has a greater length corresponding to the rolling direction of the steel sheet, to within plus or minus 10 degrees. This elongated morphology is characterized on the one hand by the ratio between the largest length Lmax and the shortest length Lmin of the island, and on the other hand by the value of the maximum size Lmax of the island. A given island is considered to have an elongated morphology, therefore forming a band, when its Lmax/Lmin ratio is greater than or equal to 15 and when its largest length Lmax is greater than 30 µm.

The formation of these bands is favored by high carbon and manganese content levels.

The minimization of the fresh martensite surface percentage in band form, in particular below 10% of the entire microstructure, in particular makes it possible to avoid any deterioration of the bending angle.

The microstructure further comprises from 4 to 35% of low carbide containing bainite, i.e., comprising fewer than 100 carbides per surface unit of 100 square micrometers.

The low carbide containing bainite is formed during cooling between 550° C. and 450° C. Its formation is in particular favored by the addition of silicon, which tends to delay the precipitation of the carbides, jointly with a small quantity of hardening elements such as carbon or manganese.

The low carbide containing bainite makes it possible to increase the elongation at break. In particular, a surface proportion of low carbide containing bainite of at least 4% makes it possible to obtain an elongation at break of at least 5%. The surface proportion of low carbide containing bainite must be limited to 35% in order to guarantee a hole expansion ratio greater than or equal to 40% and a tensile strength greater than or equal to 1180 MPa.

The microstructure further comprises 0 to 5% of ferrite, preferably 4 to 5%. The surface proportion of ferrite must be no more than 5% in order to ensure good bendability, as well as a strength greater than 1180 MPa.

The microstructure may contain retained austenite in island form, in particular forming small plates between the laths of self-tempered martensite and lower bainite. The surface proportion of retained austenite is below 5%.

Preferably, the smallest dimension of these retained austenite islands is smaller than 50 nanometers.

Furthermore, the inventors have also shown the importance of controlling the size of the austenite grains created during the annealing of the cold-rolled steel sheet, i.e., existing at high temperatures at the end of the annealing holding, before subsequent cooling. These austenite grains are qualified as "former austenite grains", since these grains are replaced by other components during later allotropic transformations upon cooling. As will be explained, the size of these former austenite grains may nevertheless be shown via different methods, in the final product. According to the invention, the fraction of former austenite grains whose size is smaller than a micrometer represents less than 10% of the total population of these former austenite grains.

The fraction of former austenite grains whose size is smaller than one micrometer is for example determined using an appropriate reagent, the etching speed of which depends on certain local segregations at the former boundaries, for example the Béchet-Beaujard reagent. To that end, a steel sample in the final state, i.e., at the end of the manufacturing method according to the invention, is etched using an appropriate reagent, in particular a reagent made up of an aqueous solution saturated with picric acid with at least 0.5% of added sodium alkyl sulfonate, for a time comprised between several minutes and one hour.

At the end of this etching, a micrographic examination of the sample makes it possible to view the boundaries of the former austenite grains, and to produce a histogram of the size of these former austenite grains, in particular to determine the fraction of the former austenite grains whose size is smaller than one micrometer.

Alternatively, the size of the former austenite grains can be determined using interrupted quenching during cooling after annealing, by adopting initial cooling conditions so as to cause intergranular ferritic germination, then to interrupt the latter by quenching.

The inventors have shown that the size of these former austenite grains conditions the phase transformation kinetics during cooling following the annealing. In particular, the small austenite grains, smaller than one micrometer, contribute to lowering the value of the temperature Ms and thus increasing the formation of fresh martensite.

Conversely, the presence of large austenite grains decreases the formation of low carbide containing bainite.

A fraction of former austenite grains whose size is smaller than a micrometer, making up less than 10% of the total population of austenite grains, therefore in particular contributes to obtaining a hole expansion ratio Ac % greater than or equal to 40% and a bending angle, for steel sheets with a thickness comprised between 0.7 mm and 1.5 mm, of at least 55°.

These microstructural characteristics are for example determined by observing the microstructure by Scanning Electron Microscopy using a field effect barrel ("SEM-FEB" technique) with a magnification greater than 1200×, coupled to an EBSD ("Electron Backscatter Diffraction") detector. The morphologies of the laths and grains are next determined by image analysis using programs known in themselves, for example the Aphelion® program.

The cold-rolled and annealed steel sheet according to the invention can be produced bare, without coating, but may also be coated. For example, such a coating may be formed by zinc or a zinc alloy, in particular a galvannealed coating comprising 7 to 12% of iron.

In particular, such a steel sheet is well suited to the deposition of the metal coating, in particular by dipping according to the usual methods.

In particular, the composition and tensile characteristics of the steel are compatible with the constraints and heat cycles of the zinc coating methods with continuous dip coating.

The coating method used depends on the targeted application. In particular, the coating may be obtained by dipping, using a vacuum deposition method such as JVD (Jet Vapor Deposition), or by cationic electrodeposition.

The inventors have shown that a steel sheet according to the invention has a tensile strength comprised between 1180 and 1320 MPa, together with a yield strength comprised between 800 and 970 MPa, before any skin-pass operation, an elongation at break of at least 5%, in particular greater than 8%, and a hole expansion ratio Ac % greater than or equal to 30%, in particular greater than or equal to 40%.

In particular, a yield strength comprised between 800 and 970 MPa is obtained while retaining a tensile strength below 1320 MPa. Furthermore, such a steel sheet has a high bending angle. In particular, when the steel sheet has a thickness comprised between 0.7 mm and 1.5 mm, the bending angle is at least 55°.

The implementation of the manufacturing method for a rolled sheet according to the invention includes the following successive steps.

A steel with a composition according to the invention is provided, and a semi-finished steel is cast from that steel. This casting may be done in ingots or continuously in the form of slabs with a thickness of about 200 mm.

The cast semi-finished steels are first brought to a temperature $T_R$ greater than 1250° C., in order to homogenize the steel and completely dissolve the precipitates.

Then, the semi-finished steel is hot-rolled in a temperature range where the structure of the steel is completely austenitic, i.e., at a temperature $T_{FL}$ greater than the transformation start temperature Ar3 of the austenite upon cooling. If the temperature $T_{FL}$ is lower than the temperature Ar3, the ferrite grains are strain hardened by the rolling and the ductility is reduced. Preferably, an end-of-rolling temperature greater than 875° C. will be chosen.

The hot-rolled steel sheet is cooled at a rate sufficient to avoid ferrite and perlite formation, in particular greater than 30° C./s, then the hot-rolled steel sheet is coiled at a temperature $T_{Bob}$ comprised between 500° C. and 580° C. The coiling temperature must be below 580° C. to avoid oxidation during coiling. An excessively low coiling temperature, i.e., below 500° C., leads to an increase in the hardness of the steel, which increases the forces necessary during later cold-rolling. The coiling temperature range also makes it possible to avoid perlite formation.

Cold-rolling is then performed, with a reduction rate for example comprised between 40% and 70% so as to introduce a deformation quantity allowing later recrystallization.

The cold-rolled steel sheet is then heated, preferably within a continuous annealing facility, with an average heating rate $V_C$ comprised between 1° C./s and 20° C./s between 600° and the temperature Ac1 (beginning of allotropic transformation temperature to austenite upon heating).

The temperature Ac1 can be measured by dilatometry, or evaluated using the following formula published in "Darstellung der Umwandlungen für technische Anwendungen und Möglichkeiten ihrer Beeinflussung", H. P. Hougardy, Werkstoffkunde Stahl Band 1, 198-231, Verlag Stahleisen, Düsseldorf, 1984:

$$Ac1=739-22*C-7*Mn+2*Si+14*Cr+13*Mo-13*Ni.$$

In this formula, the temperature Ac1 is expressed in degrees Celsius, and C, Mn, Si Cr, Mo and Ni designate the weight percentages of C, Mn, Si, Cr, Mo and Ni respectively in the composition.

During heating of the steel between 600° C. and Ac1, a beginning of recrystallization occurs and precipitates of TiNbCN form in the steel, which make it possible to control the size distribution of the austenite grains formed from Ac1.

Surprisingly, the inventors have shown that controlling the average heating rate $V_C$ between 600° C. and Ac1, and thus the heating time between 600° C. and Ac1, which corresponds to the time between the beginning of recrystallization and the beginning of the phase transformation, is decisive for the kinetics of the later phase transformations, in particular during the subsequent holding phase at the annealing temperature $T_M$. The inventors have thus shown, unexpectedly, that the choice of a mean heating rate $V_C$ between 600° C. and Ac1 comprised between 1° C./s and 20° C./s makes it possible, at the end of the manufacturing method, to obtain a steel whose microstructure consists of, in surface proportion. 60 to 95% of martensite and lower bainite, 4 to 35% of low carbide containing bainite, 0 to 5% of ferrite, and less than 5% of retained austenite in island form.

In particular, a mean heating rate $V_C$ below 1° C./s would lead to an excessively long heating time between 600° C. and Ac1, and therefore an excessive formation of ferrite and too low mechanical strength.

On the contrary, a mean heating rate $V_C$ greater than 20° C./s would lead to an overly short heating time between 600° C. and Ac1, and insufficient growth of the ferrite grains during heating between 600° C. and Ac1.

Yet the inventors have shown that the size of the ferrite grains obtained at the end of heating between 600° C. and Ac1 has an influence on the size of the austenite grains at the end of the austenization. Insufficient growth of the ferrite grains indeed causes a formation of an excessively small fraction of small austenite grains, therefore insufficient formation of self-tempered martensite at the end of the annealing, i.e., lower than 40%, due to the lowering of the value of the temperature $M_S$.

The cold-rolled steel sheet is next heated from the temperature Ac1 to an annealing temperature $T_M$ comprised between Ac3'−10° C. and Ac3'+30° C., and the cold-rolled steel sheet is held at a temperature $T_M$ for a time Dm comprised between 50 and 150 seconds.

As indicated above, the temperature Ac3' depends on the holding time at the plateau. The time Dm is chosen such that the fraction of austenite grains whose size is smaller than one micrometer represents less than 10% of the total population of the austenite grains. In particular, the holding time Dm must be long enough to form sufficiently large austenite grains. Preferably, a mean grain size will be chosen greater than 3 microns, ideally comprised between 5 and 10 microns.

Furthermore, a holding time Dm shorter than 50 s would lead to the formation at the end of the method of an excessively large proportion of ferrite.

The size of the austenite grains conditions the phase transformation kinetics during cooling following the annealing. In particular, the small austenite grains, smaller than a micrometer, contribute to lowering the value of the temperature Ms and thus decreasing the formation of self-tempered martensite.

The heating of the cold-rolled sheet at a mean heating rate $V_C$ comprised between 1° C./s and 20° C./s between 600° C. and the temperature Ac, followed by the heating of the cold-rolled steel sheet between Ac1 and $T_M$ and the holding of the cold-rolled steel sheet at the temperature $T_M$ during the time Dm comprised between 50 and 100 seconds thus makes it possible to control the size of the formed austenite grains, and more particularly to control the fraction of these grains whose size is smaller than one micrometer.

These heating parameters make it possible to obtain the microstructure according to the invention at the end of the annealing, and thus contribute to obtaining the desired mechanical characteristics.

The steel sheet is next cooled at a rate $V_R$ comprised between 10 and 100° C./s to a temperature Te comprised between 460° C. and 490° C. The cooling rate $V_R$ must be greater than 10° C./s in order to form less than 5% of ferrite and not to form too much low carbide containing bainite.

This cooling may be done from the temperature $T_M$ in one or more steps and may in the latter case involve different cooling modes, such as cold or boiling water bath, water jets or gas jets.

The steel sheet is then held at the temperature Te for a time De comprised between 5 and 150 seconds.

A partial transformation of the austenite into bainite takes place at this stage. The holding at Te must be shorter than 150 s so as to limit the surface proportion of bainite and thus obtain a sufficient proportion of martensite.

The following steps of the method differ depending on whether one is manufacturing a continuously galvanized steel sheet, in particular galvannealed, or non-coated.

According to a first embodiment, corresponding to the manufacture of a continuously galvanized steel sheet, the steel sheet is coated by continuous passage immersed in a zinc or zinc alloy bath at a temperature TZn comprised between 450° C. and 480° C., for several seconds. The temperatures Te and TZn are such that 0≤(Te−TZn)≤10° C.

The galvanized product is next cooled to ambient temperature by transforming a large fraction of the remaining austenite into fresh martensite and/or lower bainite. In this way, a cold-rolled, annealed and galvanized steel sheet is obtained containing, in surface proportion, 60 to 95% of martensite and lower bainite, 4 to 35% of low carbide containing bainite, 0 to 5% of ferrite, and less than 5% of retained austenite in island form.

If one wishes to manufacture a cold-rolled, annealed and "galvannealed" (galvanized-alloyed) steel sheet, the galvanized product is heated immediately upon leaving the zinc or zinc alloy bath at a temperature $T_G$ comprised between 490 and 550° C. for a time $t_G$ comprised between 10 and 40 s. One thus causes the inter-diffusion of the iron and the fine layer of zinc or zinc alloy deposited during the immersion, which makes it possible to obtain a galvannealed steel sheet.

The galvannealed steel sheet is next cooled to ambient temperature, while transforming a large fraction of the remaining austenite into fresh martensite and/or lower bainite. In this way, a cold-rolled, annealed and galvannealed steel sheet is obtained containing, in surface proportion, 60 to 95% of martensite and lower bainite, 4 to 35% of low carbide containing bainite, 0 to 5% of ferrite, and less than 5% of retained austenite in island form.

According to a second embodiment, corresponding to the manufacture of a non-coated steel sheet, cooling of the steel sheet is done from the temperature Te to ambient temperature in order to obtain a cold-rolled and annealed non-coated steel sheet containing, in surface proportion. 60 to 95% of martensite and lower bainite, 4 to 35% of low carbide containing bainite, 0 to 5% of ferrite, and less than 5% of retained austenite in island form.

According to a third embodiment, corresponding to the manufacture of a vacuum-coated steel sheet, one proceeds as in the second embodiment, from the temperature Te, with cooling of the steel sheet to ambient temperature, then performs vacuum deposition of the zinc or zinc alloy coating, for example by physical vapor deposition (PVD) or a method of the jet vapor deposition (JVD) type. A cold-rolled and annealed coated steel sheet is obtained, containing, in surface proportion, 60 to 95% of martensite and lower bainite, 4 to 35% of low carbide containing bainite, 0 to 5% of ferrite, and less than 5% of retained austenite in island form.

The inventors have shown that implementing this method makes it possible to obtain a steel sheet having a tensile strength comprised between 1180 and 1320 MPa, jointly with a yield strength comprised between 800 and 970 MPa (before any skin-pass operation), an elongation at break of at least 5%, or even 8%, whereof the hole expansion ratio Ac % is greater than or equal to 30%, and even greater than or equal to 40%.

Furthermore, the implementation of this method makes it possible to give the steel sheet a bending angle of at least 55° when the steel sheet has a thickness comprised between 0.7 mm and 1.5 mm.

Furthermore, the obtained steel sheet has a good weldability using the usual assembly methods, such as welding by spot resistance.

As one non-limiting example, the following results show the advantageous characteristics imparted by the invention.

Semi-finished steels have been provided whereof the compositions, expressed in weight contents (%), are given in table 1 below.

In addition to the steels 11 to 14 used to manufacture steel sheets according to the invention, the composition of steels R1 to R9 used for the manufacture of the reference steel sheets are indicated as a comparison.

TABLE 1

|    | C %   | Mn %  | Si %  | Cr %  | Ti %  | B %    | Al %  | Mo %  | Nb %   | N %    | S %   | P %   |
|----|-------|-------|-------|-------|-------|--------|-------|-------|--------|--------|-------|-------|
| I1 | 0.128 | 2.484 | 0.317 | 0.514 | 0.039 | 0.0024 | 0.026 | 0.002 | 0.016  | 0.0051 | 0.003 | 0.015 |
| I2 | 0.130 | 2.494 | 0.529 | 0.516 | 0.040 | 0.0022 | 0.026 | 0.002 | 0.016  | 0.0054 | 0.003 | 0.015 |
| I3 | 0.109 | 2.795 | 0.339 | 0.551 | 0.035 | 0.0039 | 0.028 | 0.003 | 0.039  | 0.0047 | 0.003 | 0.015 |
| I4 | 0.130 | 2.500 | 0.505 | 0.524 | 0.037 | 0.0021 | 0.030 | 0.002 | <0.002 | 0.0050 | 0.003 | 0.015 |
| I5 | 0.130 | 2.700 | 0.324 | 0.313 | 0.045 | 0.0034 | 0.030 | 0.002 | 0.029  | 0.0076 | 0.003 | 0.015 |
| R1 | 0.134 | 2.515 | 0.536 | 0.574 | 0.043 | 0.0045 | 0.017 | 0.002 | 0.031  | 0.0059 | 0.003 | 0.015 |
| R2 | 0.086 | 2.492 | 0.309 | 0.519 | 0.040 | 0.0039 | 0.028 | 0.003 | 0.028  | 0.0050 | 0.003 | 0.015 |
| R3 | 0.087 | 2.584 | 0.310 | 0520  | 0.039 | 0.0038 | 0.025 | 0.003 | 0.034  | 0.0051 | 0.003 | 0.015 |
| R4 | 0.168 | 2.873 | 0.230 | 0.040 | 0.023 | 0.0012 | 0.030 | 0.002 | 0.055  | 0.0063 | 0.003 | 0.015 |
| R5 | 0.117 | 2.245 | 0.507 | 0.515 | 0.029 | 0.0035 | 0.029 | 0.002 | 0.018  | 0.0055 | 0.003 | 0.015 |
| R6 | 0.119 | 2.239 | 0.511 | 0.515 | 0.028 | 0.0038 | 0.027 | 0.051 | 0.018  | 0.0058 | 0.003 | 0.015 |
| R7 | 0.123 | 2.489 | 0.503 | 0.521 | 0.036 | 0.0020 | 0.026 | 0.056 | <0.002 | 0.0051 | 0.003 | 0.015 |

TABLE 1-continued

|    | C %   | Mn %  | Si %  | Cr %  | Ti %  | B %    | Al %  | Mo %  | Nb %  | N %    | S %   | P %   |
|----|-------|-------|-------|-------|-------|--------|-------|-------|-------|--------|-------|-------|
| R8 | 0.124 | 2.489 | 0.505 | 0.522 | 0.037 | 0.0020 | 0.030 | 0.056 | 0.018 | 0.0055 | 0.003 | 0.015 |
| R9 | 0.124 | 2.485 | 0.682 | 0.521 | 0.037 | 0.0020 | 0.030 | 0.056 | 0.018 | 0.0060 | 0.003 | 0.015 |

The underlined values are not according to the invention.

The temperature Ac3 was calculated using the Thermo-Calc® program, the beginning of martensitic transformation temperature Ms and the carbon equivalent Ceq corresponding to each of these compositions. These values are provided in table 2 below.

In particular, the temperature Ms was determined from the following formula published by K. W. Andrews, in "Empirical Formulae for the Calculation of Some Transformation Temperatures", Journal of the Iron and Steel Institute, 203, Part 7, 1965, in which the content levels of the elements are expressed in weight percentage:

Ms (° C.)=539−423C−30.4Mn−17.7Ni−12.1Cr−11Si−7Mo.

The carbon equivalent Ceq was determined from the Nishi formula indicated above.

The underlined values are not according to the invention.

TABLE 2

|    | Ceq (%) | Ms (° C.) | Ac3 (° C.) |
|----|---------|-----------|------------|
| I1 | 0.28    | 400       | 795        |
| I2 | 0.29    | 396       | 800        |
| I3 | 0.28    | 398       | 798        |
| I4 | 0.29    | 396       | 800        |
| I5 | 0.30    | 395       | 798        |
| R1 | 0.30    | 393       | 803        |
| R2 | 0.24    | 417       | 805        |
| R3 | 0.25    | 414       | 805        |
| R4 | 0.34    | 378       | 785        |
| R5 | 0.27    | 409       | 820        |
| R6 | 0.27    | 408       | 820        |
| R7 | 0.29    | 399       | 802        |
| R8 | 0.29    | 399       | 804        |
| R9 | 0.29    | 397       | 810        |

Cast semi-finished steels corresponding to the above compositions were reheated to a temperature $T_{reheat}$ greater than 1250° C., then hot-rolled, the end of rolling temperature being equal to 850° C., therefore greater than Ar3 for all of these steels.

Then, the hot-rolled steel sheets were cooled, while avoiding the formation of ferrite and perlite, then coiled at a temperature of 545° C.

The steel sheets were next cold rolled, to a thickness of 1.4 mm.

The steel sheets were next reheated between 600° C. and Ac1, Ac1 designating the beginning of austenitic transformation temperature upon heating, with a reheating rate $V_C$, then reheated to a temperature Tm and held at the temperature Tm for a time Dm.

According to a first set of tests, the steel sheets were cooled at a rate $V_R$ to a temperature Te, then held at the temperature Te for a time De.

These tests were done according to five different treatment conditions (a to e), indicated in table 3.

According to a sixth test (f in table 3), the steel sheets were cooled from the temperature Tm to the ambient temperature, at a cooling rate $V_R$, without holding at an intermediate temperature between Tm and the ambient temperature. In table 3, NA means not applicable. Indeed, according to the treatment f, no holding at a temperature Te is done and the holding time De is therefore not relevant.

The manufactured steel sheets are thus non-coated steel sheets.

TABLE 3

| Treatment | $V_C$ (° C./s) | Tm (° C.) | Dm (s) | $V_R$ (° C./s) | Te (° C.) | De (s) |
|-----------|----------------|-----------|--------|----------------|-----------|--------|
| a | 2   | 810 | 120 | 30        | 460 | 130 |
| b | 2   | 830 | 120 | 30        | 460 | 130 |
| c | 6   | 820 | 60  | 26        | 470 | 33  |
| d | 0.2 | 820 | 2   | 26        | 460 | 33  |
| e | 0.2 | 820 | 60  | 26        | 460 | 33  |
| f | 2   | 830 | 120 | >100°C./s | 20  | NA  |

The underlined values are not according to the invention.

Using tensile strength tests, the yield strength Ys, the tensile strength TS and the total elongation A were determined for the steel sheets obtained by the different manufacturing modes. The bendability of these steel sheets was also determined by determining the maximum angle before break.

The maximum angle before break of the steel sheet is determined by applying a punch on the steel sheets so as to bend said sheet. The force to be applied to perform the bending increases until the steel sheet breaks. The measurement of the force applied during the bending thus makes it possible to detect the beginning of the break of the steel sheet, and to measure the bending angle when that break occurs.

The hole expansion ratio Ac % was also determined at each steel sheet by producing a hole by cutting in the steel sheet using a frustoconical tool so as to produce an expansion at the edges of said hole. As described in standard ISO 16630:2009, the initial diameter Di of the hole was measured before pressing, then the final diameter Df of the hole after pressing, when cracks are observed running through the thickness of the steel sheet on the edges of the hole. The ability for hole expansion Ac % was determined according to the following formula:

$$Ac\ \% = 100 * \frac{D_f - D_i}{D_i}.$$

The microstructure of the steels was also determined. The surface proportions of martensite (including the self-tempered martensite and the fresh martensite) and lower bainite (jointly), self-tempered martensite and lower bainite (jointly), and low carbide containing bainite were quantified after etching with sodium bisulfite. The surface proportion of fresh martensite was quantified after etching by a NAOH-NaNO3 reagent.

The surface proportion of ferrite was also determined by optical and scanning electron microscopic observations, where the ferritic phase was identified.

The microstructures of the steel sheets have been provided in table 4 below.

TABLE 4

| | Ac3' − 10 Ac3' + 30 (° C.) | Tm (° C.) | Martensite + lower bainite (%) | Self-tempered martensite + lower bainite (%) | Fresh martensite (%) | Low carbide containing bainite (%) | Austenite (%) | Ferrite (%) |
|---|---|---|---|---|---|---|---|---|
| I1-b | 795-835 | 830 | 95 | 91 | 4 | 5 | 0 | 0 |
| I2-b | 800-840 | 830 | 90 | 75 | 15 | 10 | 0 | 0 |
| I3-b | 798-838 | 830 | 95 | 89 | 6 | 5 | 0 | 0 |
| I4-b | 800-840 | 830 | 80 | 75 | 5 | 20 | 0 | 0 |
| I5-b | 798-838 | 830 | 80 | 70 | 10 | 20 | 0 | 0 |
| I1-d | 990-1030 | _820_ | _50_ | 0 | 50 | 0 | 0 | _50_ |
| I1-e | 805-845 | 820 | _50_ | 0 | 50 | _0_ | 0 | _50_ |
| I4-f | 800-840 | 830 | _98_ | 95 | 3 | _2_ | 0 | 0 |
| R1-b | 803-843 | 830 | 95 | 81 | 14 | _3_ | 0 | 2 |
| R2-b | 805-845 | 830 | 60 | 30 | 30 | _40_ | 0 | 0 |
| R3-b | 805-845 | 830 | 75 | 45 | 30 | 25 | 0 | 0 |
| R3-c | 815-855 | 820 | 60 | 30 | 30 | _38_ | 0 | 2 |
| R4-b | 785-825 | _830_ | 85 | 60 | 25 | 13 | 2 | 0 |
| R5-b | 820-860 | 830 | _50_ | 25 | 25 | _50_ | 0 | 0 |
| R5-c | 830-870 | _820_ | _45_ | 23 | 22 | _45_ | 0 | _10_ |
| R6-c | 830-870 | _820_ | _45_ | 9 | 36 | _45_ | 0 | _10_ |
| R7-a | 802-842 | 810 | _40_ | 35 | 5 | _60_ | 0 | 0 |
| R8-a | 804-844 | 810 | 95 | 85 | 10 | 5 | 0 | 0 |
| R9-a | 810-850 | 810 | _50_ | 10 | _40_ | _47_ | 0 | 3 |

The underlined values are not according to the invention.
The mechanical properties of the steel sheets have been provided in table 5 below.

TABLE 5

| | TS (MPa) | Ys (MPa) | A % | Bending angle | Ac % |
|---|---|---|---|---|---|
| I1-b | 1299 | 913 | 7.3 | 62 | 61.8 |
| I2-b | 1303 | 945 | 6.6 | 59 | n.d. |
| I3-b | 1299 | 947 | 6.1 | 56 | 55 |
| I4-b | 1250 | 827 | 8.7 | 58 | 43.6 |
| I5-b | 1194 | 855 | 7.5 | 63 | n.d. |
| I1-d | _1081_ | _660_ | 10 | n.d. | n.d. |
| I1-e | _1096_ | _655_ | 9.2 | n.d. | n.d. |
| I4-f | _1422_ | _1123_ | 5.9 | n.d. | n.d. |
| R1-b | _1353_ | 930 | 7.3 | 56 | 43.9 |
| R2-b | _1116_ | 800 | 8 | 71 | n.d. |
| R3-b | _1131_ | 821 | 7.6 | 56 | n.d. |
| R3-c | _1165_ | _798_ | 8.6 | n.d. | _37_ |
| R4-b | 1253 | _759_ | 9 | _50_ | n.d. |
| R5-b | _1151_ | _790_ | 6.7 | 63 | n.d. |
| R5-c | _1137_ | _720_ | 10.4 | n.d. | _30_ |
| R6-c | 1208 | _777_ | 10.7 | n.d. | _28_ |
| R7-a | 1217 | _759_ | 8.7 | 56 | n.d. |
| R8-a | 1262 | _792_ | 8.4 | 59 | n.d. |
| R9-a | 1242 | _759_ | 7.4 | 58 | n.d. |

In this table, n.d. means that the values of the properties were not determined.

The analysis of these results shows the relations between the compositions of the steels, their microstructure and mechanical properties.

The steel sheets I1-b, I2-b, I3-b, I4-b and I5-b have a composition and a microstructure according to the invention. Subsequently, these steel sheets have a tensile strength, a yield strength, an elongation, a bending angle and a hole expansion ratio that satisfy the targeted values.

Figure 2:
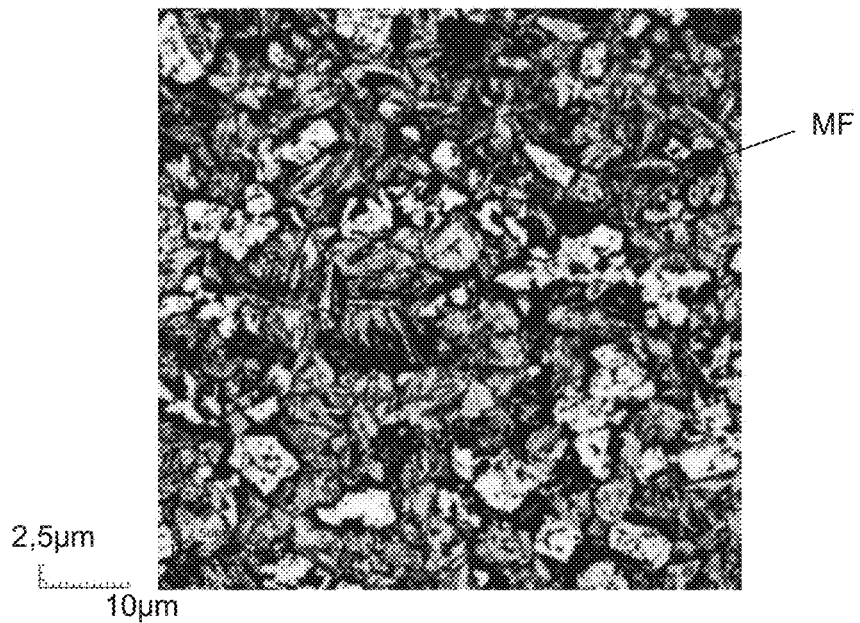
FIG. 2 shows the microstructure of the steel sheet of FIG. 1. shown by a second type of etching.

FIGS. 1 and 2 illustrate microstructure of the steel sheet I4-b. FIG. 1 results from etching of the steel sheet by sodium bisulfite, while FIG. 2 results from the etching of the steel sheet by the NAOH-NaNO3. FIG. 1 shows the self-tempered martensite and the lower bainite (M+BI), as well as the low carbide containing bainite (BFC). FIG. 2 shows the fresh martensite (MF) in the form of darker zones.

The steel sheet according to example R1-b shows an excessively high Cr content level and an excessively high B content level, such that its tensile strength TS is too high. Thus, although one obtains a satisfactory yield strength YS, this yield strength is obtained jointly with an excessively high tensile strength TS.

The steel sheets according to R2-b and R3-b have an excessively low C content level, and thus do not have satisfactory tensile strength.

In particular, the steel sheet according to example R2-b comprises a high low carbide containing bainite fraction, due to the low C content level of the steel making up the steel sheet, which leads to obtaining a relatively low tensile strength.

Furthermore, a low C content level leads to increasing the temperature Ac3, and thus the temperature Ac3'.

For example R3, according to manufacturing condition c, an excessively high number of small austenite grains therefore forms, which leads to the formation at the end of the annealing of an excessively low surface proportion of self-tempered martensite and lower bainite, an excessively high proportion of fresh martensite, and an excessively high surface proportion of low carbide containing bainite.

This leads to obtaining an insufficient strength TS and yield strength YS, and a hole expansion ratio smaller than the desired minimum ratio.

The steel sheet according to example R4-b has excessively high C and Mn content levels, excessively low Cr and Si content levels, an excessively high Nb content level and an excessively low B content level, which leads to obtaining a bending angle that is too small.

In particular, the high content levels in Mn and C in example R4-b lead to the excessive formation of fresh martensite in band form, which causes a deterioration of the bending angle. Furthermore, due to the high content levels of carbon and manganese, the weldability of the steel is deteriorated. In particular, the carbon equivalent Ceq determined from the aforementioned Nishi formula is equal to 0.34%, therefore greater than the desired maximum value of 0.30%.

Example R5 shows an excessively low Mn content level, which, combined with a high Si content level (0.507%), leads to an excessive formation of low carbide containing bainite according to treatments b and c.

Thus, examples R5-b and R5-c have an insufficient tensile strength and yield strength.

Furthermore, the excessively low Mn content level leads to a high temperature Ac3=820° C. According to manufacturing condition c, Ac3=840° C. therefore has a high value, such that the temperature Tm=820° C. is lower than Ac3'−10° C. As a result, the optimization is not complete, an excessively high surface proportion of ferrite remains in the steel, and too little self-tempered martensite and lower bainite.

Consequently, the tensile strength TS and the yield strength YS are insufficient, as is the hole expansion ratio Ac %.

Likewise, example R6 shows an excessively low Mn content level, which, combined with a high Si content level (0.511%), leads to excessive formation of low carbide containing bainite.

Furthermore, the excessively low Mn content level, which leads to a high temperature Ac3=820° C., such that according to route c, the temperature Tm=820° C. is less than Ac3'−10° C.=830° C.

As a result, the optimization is not complete, and an excessively high surface proportion of ferrite remains in the steel, as well as too little self-tempered martensite and lower bainite. The yield strength and the hole expansion ratio are consequently deteriorated. Nevertheless, the high Mo content level makes it possible to maintain a high tensile strength TS.

Example R7 has an excessively high Mo content level. Due to the low Nb content level of example R7, this high Mo content level results in decreasing the size of the former austenitic grains, and therefore leads, due to the decrease in the value of the temperature Ms, to insufficient formation of martensite and lower bainite, in particular self-tempered martensite and lower bainite at the end of the annealing and excessive formation of fresh martensite.

For example R7, this results in an insufficient yield strength. Nevertheless, the high Mo content level makes it possible to maintain a high tensile strength TS.

The composition of the steel R8 also has an excessively high Mo content level.

Example R9 shows an excessively high Si content level, leading to an excessive formation of low carbide containing bainite and an insufficient formation of martensite and lower bainite, which leads to obtaining an insufficient yield strength. For example I1-d, the heating rate Vc and holding time Dm are too low. Thus, the temperature Tm is below Ac3'−10. As a result, the optimization is not complete, and excessive growth of ferrite grains is observed. An excessive surface proportion of ferrite, insufficient self-tempered martensite and lower bainite, and insufficient low carbide containing bainite thus remain in the steel. The tensile strength and the yield strength are therefore insufficient.

For example I1-e, the heating rate Vc is too low. Thus, excessive ferrite grain growth is observed. An excessive surface proportion of ferrite, insufficient self-tempered martensite and lower bainite, and insufficient low carbide containing bainite thus remain in the steel. The tensile strength and the yield strength are therefore insufficient.

For example I4-f, the cooling rate $V_R$ is too high. Thus, too much martensite and lower bainite, and not enough low carbide containing bainite and fresh martensite, form.

The tensile strength and yield strength are therefore well beyond those that are targeted.

What is claimed is:

1. A cold-rolled and annealed steel sheet, having a chemical composition consisting of with contents expressed by weight percent:
   0.10≤C≤0.13%
   2.4≤Mn≤2.8%
   0.30≤Si≤0.55%
   0.30≤Cr≤0.56%
   0.020≤Ti≤0.050%
   0.0020≤B≤0.0040%
   0.005≤Al≤0.050%
   Mo≤0.010%
   Nb≤0.040%
   0.002≤N≤0.008%
   S≤0.005%
   P≤0.020%,
   and a remainder consisting of iron and unavoidable impurities resulting from smelting, wherein the steel sheet has a microstructure consisting of, in surface proportions:
   martensite and/or lower bainite, a sum of the surface proportions of martensite and lower bainite being comprised between 60 and 95%,
   4 to 35% of low carbide containing bainite, containing less than 100 carbides per surface unit of 100 square micrometers,
   0 to 5% of ferrite, and
   less than 5% of retained austenite in island form, and
   wherein the martensite consists of fresh martensite and/or self-tempered martensite, a sum of the surface proportions of self-tempered martensite and lower bainite being comprised between 40 and 95%.

2. The steel sheet according to claim 1, wherein a surface proportion of fresh martensite is comprised between 4% and 20%.

3. The steel sheet according to claim 1, wherein a surface proportion of fresh martensite is comprised between 4% and 15%.

4. The steel sheet according to claim 1, wherein said self-tempered martensite and said lower bainite contain rod-shaped carbides oriented in directions <111> of martensitic and bainite laths.

5. The steel sheet according to claim 1, wherein the surface proportion of ferrite is comprised between 4 and 5%.

6. The steel sheet according to claim 1, wherein the retained austenite islands have a smallest dimension smaller than 50 nanometers.

7. The steel sheet according to claim 1, wherein a fraction of former austenite grains created by the annealing whose size is less than one micrometer represents less than 10% of a total population of said former austenite grains.

8. The steel sheet according to claim 1, wherein said steel sheet has a tensile strength comprised between 1180 MPa and 1320 MPa, and a hole expansion ratio Ac % greater than or equal to 40%.

9. The steel sheet according to claim 1, wherein said steel sheet has a thickness comprised between 0.7 mm and 1.5 mm, and said steel sheet has a bending angle greater than or equal to 55°.

10. The steel sheet according to claim 1, wherein Mn is present in the chemical composition in an amount, by weight percent, comprised between 2.5% and 2.8%.

11. The steel sheet according to claim 1, wherein Si is present in the chemical composition in an amount, by weight percent, comprised between 0.30 and 0.5%.

12. The steel sheet according to claim 1, wherein Al is present in the chemical composition in an amount, by weight percent, comprised between 0.005% and 0.030%.

13. The steel sheet according to claim 1, wherein said steel sheet comprises a zinc or zinc alloy coating, obtained through continuous dip coating.

14. The steel sheet according to claim 13, wherein said zinc or zinc alloy coating is a galvannealed coating, said zinc or zinc alloy coating comprising 7 to 12% of iron.

15. The steel sheet according to claim 1, wherein said steel sheet comprises a zinc or zinc alloy coating, obtained through vacuum deposition.

16. A method for manufacturing a cold-rolled and annealed steel sheet according to claim 1, comprising the following successive steps:

providing a semi-finished steel having a chemical composition consisting of, with contents expressed by weight percent:
0.10≤C≤0.13%
2.4≤Mn≤2.8%
0.30≤Si≤0.55%
0.30≤Cr≤0.56%
0.020≤Ti≤0.050%
0.0020≤B≤0.0040%
0.005≤Al≤0.050%
Mo≤0.010%
Nb≤0.040%
0.002≤N≤0.008%
S≤0.005%
P≤0.020% and a remainder consisting of iron and unavoidable impurities resulting from smelting, then heating said semi-finished steel to a temperature $T_{reheat}$ greater than or equal to 1250° C., then hot-rolling said semi-finished steel, with an end of rolling temperature greater than a temperature Ar3 of the beginning of transformation of austenite upon cooling, to obtain a hot-rolled steel sheet, then cooling said hot-rolled steel sheet at a rate sufficient to avoid a formation of ferrite and perlite, then coiling said hot-rolled steel sheet at a temperature below 580° C., then cold-rolling said hot-rolled steel sheet to obtain a cold-rolled steel sheet, then reheating said cold-rolled steel sheet between 600° C. and Ac1, Ac1 designating a beginning of austenitic transformation temperature upon heating, at a heating rate $V_R$ comprised between 1 and 20° C./s, then reheating said cold-rolled steel sheet to a temperature Tm comprised between Ac3'−10° C. and Ac3'+30° C., and holding said cold-rolled steel sheet at said temperature Tm for a time Dm comprised between 50 and 150 seconds, with Ac3'=Min{Ac3+1200/Dm; 1000° C.}, where Ac3 and Ac3' are expressed in degrees Celsius and Dm in seconds, and where Ac3 designates an end of austenitic transformation temperature upon heating as determined independently from a holding time at that temperature Ac3, then cooling the steel sheet at a rate comprised between 10 and 150° C./s to a temperature Te comprised between 460° C. and 490° C., then holding said steel sheet at the temperature Te for a time comprised between 5 and 150 seconds, then coating the steel sheet by continuous dipping in a zinc or zinc alloy bath at a temperature TZn comprised between 450° C. and 480° C., said temperatures Te and TZn being such that 0≤(Te-TZn)<10° C.

17. The method according to claim 16, further comprising a step of heating the coated steel sheet to a temperature comprised between 490° C. and 550° C. for a time $t_G$ comprised between 10 s and 40 s.

18. A method for manufacturing a cold-rolled and annealed steel sheet according to claim 1, comprising the following successive steps:

providing a semi-finished steel having a chemical composition consisting of, with contents expressed by weight percent:
0.10≤C≤0.13%
2.4≤Mn≤2.8%
0.30≤Si≤0.55%
0.30≤Cr≤0.56%
0.020≤Ti≤0.050%
0.0020≤B≤0.0040%
0.005≤Al≤0.050%
Mo≤0.010%
Nb≤0.040%
0.002≤N≤0.008%
S≤0.005%
P≤0.020% and a remainder consisting of iron and unavoidable impurities resulting from smelting, then heating said semi-finished steel to a temperature $T_{reheat}$ greater than or equal to 1250° C., then hot-rolling said semi-finished steel, with an end of rolling temperature greater than Ar3, to obtain a hot-rolled steel sheet, then cooling said hot-rolled steel sheet at a rate sufficient to avoid a formation of ferrite and perlite, then coiling said hot-rolled steel sheet at a temperature below 580° C., then cold-rolling said hot-rolled steel sheet to obtain a cold-rolled steel sheet, then reheating said cold-rolled steel sheet between 600° C. and Ac1, Ac1 designating a beginning of austenitic transformation temperature upon heating, at a heating rate $V_R$ comprised between 1 and 20° C./s, then reheating said cold-rolled steel sheet to a temperature Tm comprised between Ac3-10° C. and Ac3+30° C., and holding said cold-rolled steel sheet at the temperature Tm for a time Dm comprised between 50 and 150 seconds, with Ac3'=Min{Ac3+1200/Dm; 1000° C.}, where Ac3 and Ac3' are expressed in degrees Celsius and Dm in seconds, and where Ac3 designates an end of austenitic transformation temperature upon heating as determined independently from a holding time at that temperature Ac3, then cooling the steel sheet at a rate comprised between 10 and 100° C./s to a temperature Te comprised between 460° C. and 490° C., then holding said steel sheet at the temperature Te for a time comprised between 5 and 150 seconds, then cooling said steel sheet to ambient temperature.

19. The method according to claim 18, wherein a zinc or zinc alloy coating is performed by vacuum deposition after said cooling step to ambient temperature.

20. The method according to claim 19, wherein said vacuum deposition is performed by physical vapor deposition (PVD).

21. The method according to claim 19, wherein said vacuum deposition is performed by jet vapor deposition (JVD).

* * * * *